United States Patent
Goya et al.

(10) Patent No.: US 8,633,378 B2
(45) Date of Patent: Jan. 21, 2014

(54) METHOD OF SETTING CONDITIONS FOR FILM DEPOSITION, PHOTOVOLTAIC DEVICE, AND PRODUCTION PROCESS, PRODUCTION APPARATUS AND TEST METHOD FOR SAME

(75) Inventors: Saneyuki Goya, Yokohama (JP); Youji Nakano, Yokohama (JP); Kouji Satake, Yokohama (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 1424 days.

(21) Appl. No.: 12/308,866

(22) PCT Filed: Aug. 30, 2007

(86) PCT No.: PCT/JP2007/066944
§ 371 (c)(1),
(2), (4) Date: Dec. 24, 2008

(87) PCT Pub. No.: WO2008/029716
PCT Pub. Date: Mar. 13, 2008

(65) Prior Publication Data
US 2009/0183775 A1 Jul. 23, 2009

(30) Foreign Application Priority Data
Sep. 4, 2006 (JP) .................................. 2006-239608

(51) Int. Cl.
*H01L 31/18* (2006.01)
(52) U.S. Cl.
USPC ................ 136/261; 136/252; 438/57; 438/96

(58) Field of Classification Search
USPC ................................ 136/261, 252; 438/57, 96
See application file for complete search history.

(56) References Cited

U.S. PATENT DOCUMENTS

| | | | | |
|---|---|---|---|---|
| 5,447,889 A | * | 9/1995 | Sano | 438/795 |
| 6,166,319 A | * | 12/2000 | Matsuyama | 136/249 |
| 6,222,117 B1 | * | 4/2001 | Shiozaki | 136/256 |
| 6,383,576 B1 | * | 5/2002 | Matsuyama | 427/585 |
| 6,488,995 B1 | * | 12/2002 | Nishimoto et al. | 427/574 |
| 6,531,654 B2 | * | 3/2003 | Sugiyama et al. | 136/258 |
| 2001/0035206 A1 | * | 11/2001 | Inamasu et al. | 136/255 |

FOREIGN PATENT DOCUMENTS

| JP | S59-181581 A | 10/1984 |
|---|---|---|
| JP | H05-275726 A | 10/1993 |
| JP | H11-102947 A | 4/1999 |

(Continued)

OTHER PUBLICATIONS

Morita et al., JP 2004-087933A online machine translation provided by "The Industrial Property Digital Library (IPDL)". Translated on Dec. 19, 2011.*

(Continued)

*Primary Examiner* — Golam Mowla
(74) *Attorney, Agent, or Firm* — Manabu Kanesaka; Kenneth M. Berner; Benjamin J. Hauptman

(57) ABSTRACT

A photovoltaic device having a high conversion efficiency is produced in a stable manner. The conditions for film deposition of a microcrystalline silicon photovoltaic layer (4) in a photovoltaic device are set based on the Raman peak ratio within a Raman spectrum obtained at the substrate (1) side of the microcrystalline silicon layer (4), and the Raman peak ratio within a Raman spectrum obtained at the opposite side to the substrate (1).

6 Claims, 7 Drawing Sheets

(56) References Cited

FOREIGN PATENT DOCUMENTS

| | | |
|---|---|---|
| JP | 2000-174310 A | 6/2000 |
| JP | 2001-156311 | 6/2001 |
| JP | 2001-237189 A | 8/2001 |
| JP | 2002-26348 A | 1/2002 |
| JP | 2002-110550 | 4/2002 |
| JP | 2002-134769 | 5/2002 |
| JP | 2002-151719 | 5/2002 |
| JP | 2002-329878 A | 11/2002 |
| JP | 2004-87933 A | 3/2004 |
| JP | 2005-31130 A | 2/2005 |
| JP | 2006-032800 A | 2/2006 |
| JP | 2006-216921 A | 8/2006 |
| WO | WO2004/036656 A2 | 4/2004 |

OTHER PUBLICATIONS

JP 05-275726 Online Machine Translation, Oct. 22, 1993, Translated on Jun. 28, 2012.*
JP 2002-026348 Online Machine Translation, Jan. 25, 2002, Translated on Jun. 28, 2012.*
JP 2006-032800 Online Machine Translation, Feb. 2, 2006, Translated on Jun. 28, 2012.*

* cited by examiner

METHOD OF SETTING CONDITIONS FOR FILM DEPOSITION, PHOTOVOLTAIC DEVICE, AND PRODUCTION PROCESS, PRODUCTION APPARATUS AND TEST METHOD FOR SAME

TECHNICAL FIELD

The present invention relates to a method of setting the conditions for film deposition of a microcrystalline silicon photovoltaic layer formed from a layer containing mainly microcrystalline silicon, a photovoltaic device having a microcrystalline silicon photovoltaic-layer on top of a substrate, and a production process, a production apparatus and a test method for the photovoltaic device.

BACKGROUND ART

The use of silicon-based thin-film photovoltaic devices as photovoltaic devices such as solar cells is already known. These photovoltaic devices generally comprise a first transparent electrode, a silicon-based semiconductor layer (a photovoltaic layer), a second transparent electrode, and a metal electrode film deposited sequentially on top of a substrate. This type of structure, wherein the photovoltaic device contains a single photovoltaic layer, is called a single structure. Furthermore, in order to improve the photovoltaic conversion efficiency of the photovoltaic device, a method is used in which a plurality of photovoltaic layers formed from semiconductors with different band gaps are stacked together. This type of photovoltaic device that uses a plurality of stacked photovoltaic layers is called a multi-junction photovoltaic device, and structures in which two photovoltaic layers with different absorption wavelength bands are stacked are known as tandem structures, whereas structures containing three stacked layers are known as triple structures. Taking a tandem structure photovoltaic device as an example, an amorphous silicon that absorbs short wavelength light is used as the top cell, which refers to the photovoltaic layer on the sunlight incident side of the device, and a microcrystalline silicon that absorbs longer wavelength light is used as the bottom cell, which refers to the other photovoltaic layer, in order to absorb the light not absorbed by the top cell.

The film deposition conditions for this microcrystalline silicon are very different from the film deposition conditions for the amorphous silicon that has conventionally been used for photovoltaic layers. In order to improve the photovoltaic conversion efficiency (the conversion efficiency), improving the film quality of the deposited microcrystalline silicon film is essential.

The above photovoltaic layers formed from thin films of silicon-based semiconductors are deposited using a plasma enhanced CVD method or the like, and in order to reduce the photovoltaic device production costs, accelerating the photovoltaic layer film deposition rate is desirable. For example, patent citation 1 and patent citation 2 disclose conditions for depositing photovoltaic layers formed from crystalline silicon using a plasma enhanced CVD method at a film deposition rate of not less than 1 μm/h (approximately 0.28 nm/s).

Patent Citation 1: Japanese Unexamined Patent Application, Publication No. 2000-174310

Patent Citation 2: Japanese Unexamined Patent Application, Publication No. 2001-237189

DISCLOSURE OF INVENTION

Under the film deposition conditions disclosed in the patent citation 1 and the patent citation 2, the film deposition rate is limited to approximately 1 nm/s, and further increases are now being sought. One conceivable method of increasing the film deposition rate in a plasma enhanced CVD method would be to increase the ultra high frequency electrical power supplied to the discharge electrode of the plasma enhanced CVD apparatus. However, this leads to the generation of high-order silanes and increased ion impact, resulting in problems such as a deterioration in the film quality of the deposited thin film, and a reduction in the photovoltaic conversion efficiency. In other words, the film deposition rate and the conversion efficiency generally exist in a trade-off type relationship, and the process domain for which a high conversion efficiency can be obtained within the high-rate deposition region is very narrow. As a result, conditions under which the film deposition rate for the microcrystalline silicon photovoltaic layer can be increased, while the conversion efficiency of the resulting photovoltaic layer is maintained have been keenly sought.

The present invention was made in light of the above circumstances, and has an object of providing a method of setting the conditions for the film deposition of a microcrystalline silicon photovoltaic layer that enables the stable production of a photovoltaic device having a high conversion efficiency, as well as providing a photovoltaic device formed using this method, and a production process, a production apparatus and a test method for the photovoltaic device.

In order to achieve the above object, a method of setting the conditions for the film deposition of a microcrystalline silicon photovoltaic layer according to the present invention, a photovoltaic device formed using this method, and a production process, a production apparatus and a test method for the photovoltaic device adopt the aspects described below.

The method of setting conditions for film deposition according to the present invention is a method of setting the conditions for film deposition of a microcrystalline silicon photovoltaic layer formed from a layer containing mainly microcrystalline silicon and provided within a photovoltaic device that comprises the microcrystalline silicon photovoltaic layer on top of a substrate, the method comprising the steps of: depositing the microcrystalline silicon layer formed from a layer containing mainly microcrystalline silicon on top of a condition-setting substrate under predetermined conditions; performing, at least once, a condition-setting step that comprises performing a first Raman spectroscopic measurement, by irradiating a measuring light onto a portion of the microcrystalline silicon layer on the side of the condition-setting substrate, and determining a first Raman peak ratio $Ic(1)/Ia(1)$ that represents the ratio within the resulting Raman spectrum of the peak intensity $Ic(1)$ of the crystalline silicon phase relative to the peak intensity $Ia(1)$ of the amorphous silicon phase, and then performing a second Raman spectroscopic measurement, by irradiating the measuring light onto a portion of the microcrystalline silicon layer on the opposite side to the condition-setting substrate, and determining a second Raman peak ratio $Ic(2)/Ia(2)$ that represents the ratio within the resulting Raman spectrum of the peak intensity $Ic(2)$ of the crystalline silicon phase relative to the peak intensity $Ia(2)$ of the amorphous silicon phase; and setting the conditions for film deposition of the microcrystalline silicon photovoltaic layer based on the first Raman peak ratio and the second Raman peak ratio.

By employing this method of setting the conditions for film deposition, conditions for the film deposition of the microcrystalline silicon photovoltaic layer that enable the stable production of a photovoltaic device having a high conversion efficiency can be set prior to production.

In order to enable stable production of a photovoltaic device with a high conversion efficiency, the film deposition conditions are preferably set so that the ratio of the above second Raman peak ratio relative to the first Raman peak ratio [Ic(2)/Ia(2)]/[Ic(1)/Ia(1)] is not more than 3. Film deposition conditions under which the first Raman peak ratio and the second Raman peak ratio are both not less than 2 and not more than 8 are even more preferred. Furthermore, film deposition conditions under which the first Raman peak ratio is not less than 2 and not more than 6.5, and the second Raman peak ratio is not less than 3.5 and not more than 8 are particularly desirable.

Alternatively, the method of setting conditions for film deposition according to the present invention may also be a method of setting the conditions for film deposition of a microcrystalline silicon photovoltaic layer formed from a layer containing mainly microcrystalline silicon and provided within a photovoltaic device that comprises the microcrystalline silicon photovoltaic layer on top of a substrate, the method comprising the steps of: depositing the microcrystalline silicon layer formed from a layer containing mainly microcrystalline silicon on top of a condition-setting substrate under predetermined conditions; performing, at least once, a condition-setting step that comprises performing a second Raman spectroscopic measurement, by irradiating a measuring light onto a portion of the microcrystalline silicon layer on the opposite side to the condition-setting substrate, and determining a second Raman peak ratio Ic(2)/Ia(2) that represents the ratio within the resulting Raman spectrum of the peak intensity Ic(2) of the crystalline silicon phase relative to the peak intensity Ia(2) of the amorphous silicon phase, performing etching to remove a portion of the microcrystalline silicon layer from the opposite side to the condition-setting substrate, and then performing a first Raman spectroscopic measurement, by irradiating the measuring light onto a portion of the microcrystalline silicon layer on the opposite side to the condition-setting substrate, where the microcrystalline silicon layer has been partially removed, and determining a first Raman peak ratio Ic(1)/Ia(1) that represents the ratio within the resulting Raman spectrum of the peak intensity Ic(1) of the crystalline silicon phase relative to the peak intensity Ia(1) of the amorphous silicon phase; and setting the conditions for film deposition of the microcrystalline silicon photovoltaic layer based on the first Raman peak ratio and the second Raman peak ratio.

Alternatively, the method of setting conditions for film deposition according to the present invention may also be a method of setting the conditions for film deposition of a microcrystalline silicon photovoltaic layer formed from a layer containing mainly microcrystalline silicon and provided within a photovoltaic device that comprises the microcrystalline silicon photovoltaic layer on top of a substrate, the method comprising the steps of: depositing the microcrystalline silicon layer formed from a layer containing mainly microcrystalline silicon on top of a condition-setting substrate under predetermined conditions; performing, at least once, a condition-setting step that comprises performing a first Raman spectroscopic measurement, by irradiating a first measuring light onto a portion of the microcrystalline silicon layer, either on the side of the condition-setting substrate or on the opposite side to the substrate, and determining a first Raman peak ratio Ic(1)/Ia(1) that represents the ratio within the resulting Raman spectrum of the peak intensity Ic(1) of the crystalline silicon phase relative to the peak intensity Ia(1) of the amorphous silicon phase, and then performing a second Raman spectroscopic measurement, by irradiating a second measuring light with a different wavelength from the first measuring light onto a portion of the microcrystalline silicon layer on the same side as that irradiated with the first measuring light, and determining a second Raman peak ratio Ic(2)/Ia(2) that represents the ratio within the resulting Raman spectrum of the peak intensity Ic(2) of the crystalline silicon phase relative to the peak intensity Ia(2) of the amorphous silicon phase; and setting the conditions for film deposition of the microcrystalline silicon photovoltaic layer based on the first Raman peak ratio and the second Raman peak ratio.

The conditions for film deposition refer to those conditions that have an effect on the film quality (the crystallinity) of the microcrystalline silicon layer, and include at least one condition selected from amongst the pressure, substrate temperature, silane concentration within the reaction gas, plasma electrical power, plasma frequency, and the electrode-substrate separation.

A process for producing a photovoltaic device according to the present invention is a process for producing a photovoltaic device comprising a microcrystalline silicon photovoltaic layer formed from a layer containing mainly microcrystalline silicon provided on top of a substrate, wherein film deposition of the microcrystalline silicon photovoltaic layer on the substrate is performed under film deposition conditions set using the method of setting conditions for film deposition described above.

This production process can be used favorably even in cases where the film deposition rate for the microcrystalline silicon photovoltaic layer is 2 nm/s.

Furthermore, an apparatus for producing a photovoltaic device according to the present invention is an apparatus for producing a photovoltaic device comprising a microcrystalline silicon photovoltaic layer formed from a layer containing mainly microcrystalline silicon provided on top of a substrate, wherein film deposition of the microcrystalline silicon photovoltaic layer on the substrate is performed under film deposition conditions set using the method of setting conditions for film deposition described above.

According to the above-described process and apparatus for producing photovoltaic layer, a photovoltaic device having a high conversion efficiency can be produced in a stable manner even in those cases where the microcrystalline silicon photovoltaic layer is deposited at a high rate.

A photovoltaic device of the present invention is a photovoltaic device comprising a microcrystalline silicon photovoltaic layer formed from a layer containing mainly microcrystalline silicon provided on top of a substrate, wherein if a measuring light is irradiated onto a portion of the microcrystalline silicon photovoltaic layer on the side of the substrate, and the ratio within the resulting Raman spectrum of the peak intensity Ic(1) of the crystalline silicon phase relative to the peak intensity Ia(1) of the amorphous silicon phase is deemed the first Raman peak ratio Ic(1)/Ia(1), and the measuring light is then irradiated onto a portion of the microcrystalline silicon photovoltaic layer on the opposite side to the substrate, and the ratio within the resulting Raman spectrum of the peak intensity Ic(2) of the crystalline silicon phase relative to the peak intensity Ia(2) of the amorphous silicon phase is deemed the second Raman peak ratio Ic(2)/Ia(2), then the ratio of the second Raman peak ratio relative to the first Raman peak ratio [Ic(2)/Ia(2)]/[Ic(1)/Ia(1)] is not more than 3.

This photovoltaic device has a suitable crystallization ratio across the entire microcrystalline silicon photovoltaic layer, and exhibits a stable and high conversion efficiency.

The first Raman peak ratio and the second Raman peak ratio are preferably both not less than 2 and not more than 8. The first Raman peak ratio is most preferably not less than 2 and not more than 6.5, and the second Raman peak ratio is most preferably not less than 3.5 and not more than 8.

Alternatively, the photovoltaic device of the present invention may also be a photovoltaic device comprising a microcrystalline silicon photovoltaic layer formed from a layer containing mainly microcrystalline silicon provided on top of a substrate, wherein if a first measuring light with a wavelength of 700 nm is irradiated onto a portion of the microcrystalline silicon photovoltaic layer on the opposite side to the substrate, and the ratio within the resulting Raman spectrum of the peak intensity Ic(1) of the crystalline silicon phase relative to the peak intensity Ia(1) of the amorphous silicon phase is deemed the first Raman peak ratio Ic(1)/Ia(1), and a second measuring light with a wavelength of 532 nm is then irradiated onto a portion of the microcrystalline silicon photovoltaic layer on the opposite side to the substrate, and the ratio within the resulting Raman spectrum of the peak intensity Ic(2) of the crystalline silicon phase relative to the peak intensity Ia(2) of the amorphous silicon phase is deemed the second Raman peak ratio Ic(2)/Ia(2), then the ratio of the second Raman peak ratio relative to the first Raman peak ratio [Ic(2)/Ia(2)]/[Ic(1)/Ia(1)] is not more than 2, and is preferably not more than 1.5. In this photovoltaic device, the first Raman peak ratio is preferably not less than 3 and not more than 6, and the second Raman peak ratio is preferably not less than 3.5 and not more than 8.

A method of testing a photovoltaic device according to the present invention is a method of testing a photovoltaic device comprising a microcrystalline silicon photovoltaic layer formed from a layer containing mainly microcrystalline silicon provided on top of a substrate, the method comprising the steps of: performing a first Raman spectroscopic measurement by irradiating a measuring light onto a portion of the microcrystalline silicon photovoltaic layer on the side of the substrate, and determining a first Raman peak ratio Ic(1)/Ia(1) that represents the ratio within the resulting Raman spectrum of the peak intensity Ic(1) of the crystalline silicon phase relative to the peak intensity Ia(1) of the amorphous silicon phase; performing a second Raman spectroscopic measurement by irradiating the measuring light onto a portion of the microcrystalline silicon photovoltaic layer on the opposite side to the substrate, and determining a second Raman peak ratio Ic(2)/Ia(2) that represents the ratio within the resulting Raman spectrum of the peak intensity Ic(2) of the crystalline silicon phase relative to the peak intensity Ia(2) of the amorphous silicon phase; and performing an evaluation of the microcrystalline silicon photovoltaic layer based on the first Raman peak ratio and the second Raman peak ratio.

Alternatively, the method of testing a photovoltaic device according to the present invention may be a method of testing a photovoltaic device comprising a microcrystalline silicon photovoltaic layer formed from a layer containing mainly microcrystalline silicon provided on top of a substrate, the method comprising the steps of: performing a second Raman spectroscopic measurement by irradiating a measuring light onto a portion of the microcrystalline silicon photovoltaic layer on the opposite side to the substrate, and determining a second Raman peak ratio Ic(2)/Ia(2) that represents the ratio within the resulting Raman spectrum of the peak intensity Ic(2) of the crystalline silicon phase relative to the peak intensity Ia(2) of the amorphous silicon phase; performing etching to remove a portion of the microcrystalline silicon photovoltaic layer from the opposite side to the substrate; performing a first Raman spectroscopic measurement by irradiating the measuring light onto a portion of the microcrystalline silicon photovoltaic layer on the opposite side to the substrate, where the microcrystalline silicon layer has been partially removed, and determining a first Raman peak ratio Ic(1)/Ia(1) that represents the ratio within the resulting Raman spectrum of the peak intensity Ic(1) of the crystalline silicon phase relative to the peak intensity Ia(1) of the amorphous silicon phase; and performing an evaluation of the microcrystalline silicon photovoltaic layer based on the first Raman peak ratio and the second Raman peak ratio.

Alternatively, the method of testing a photovoltaic device according to the present invention may be a method of testing a photovoltaic device comprising a microcrystalline silicon photovoltaic layer formed from a layer containing mainly microcrystalline silicon provided on top of a substrate, the method comprising the steps of: performing a first Raman spectroscopic measurement by irradiating a first measuring light onto a portion of the microcrystalline silicon photovoltaic layer, either on the side of the substrate or on the opposite side to the substrate, and determining a first Raman peak ratio Ic(1)/Ia(1) that represents the ratio within the resulting Raman spectrum of the peak intensity Ic(1) of the crystalline silicon phase relative to the peak intensity Ia(1) of the amorphous silicon phase; performing a second Raman spectroscopic measurement by irradiating a second measuring light with a different wavelength from the first measuring light onto a portion of the microcrystalline silicon photovoltaic layer on the same side as that irradiated with the first measuring light, and determining a second Raman peak ratio Ic(2)/Ia(2) that represents the ratio within the resulting Raman spectrum of the peak intensity Ic(2) of the crystalline silicon phase relative to the peak intensity Ia(2) of the amorphous silicon phase; and performing an evaluation of the microcrystalline silicon photovoltaic layer based on the first Raman peak ratio and the second Raman peak ratio.

By employing any of the above methods of testing a photovoltaic device, Raman spectroscopic analyses can be used to evaluate the film quality of the entire microcrystalline silicon photovoltaic layer and test the photovoltaic device.

The present invention is able to provide a method of setting the conditions for the film deposition of a microcrystalline silicon photovoltaic layer that enables the stable production of a photovoltaic device having a high conversion efficiency, and is also able to provide a photovoltaic device formed using this method, and a production process, a production apparatus and a test method for the photovoltaic device.

| Explanation of Reference Signs: | |
|---|---|
| 1: | Electrically insulating substrate |
| 2: | First transparent conductive film |
| 4: | Photovoltaic layer |
| 5: | First photovoltaic layer (top cell) |
| 6: | Second photovoltaic layer (bottom cell) |
| 8: | Second transparent conductive film |
| 9: | Back electrode |
| 11: | Reaction chamber |
| 12: | Anode (support section) |
| 13: | Discharge electrode (cathode) |
| 14: | Raw material gas inlet |
| 15: | Gas flow rate controller |
| 16: | Gas storage unit |
| 17: | Ultra high frequency power source |
| 18: | Raw material gas supply unit |
| 19: | Raw material gas |
| 20: | Plasma enhanced CVD apparatus |

BEST MODE FOR CARRYING OUT THE INVENTION

Embodiments of the present invention are described below with reference to the drawings.

Figure 1:
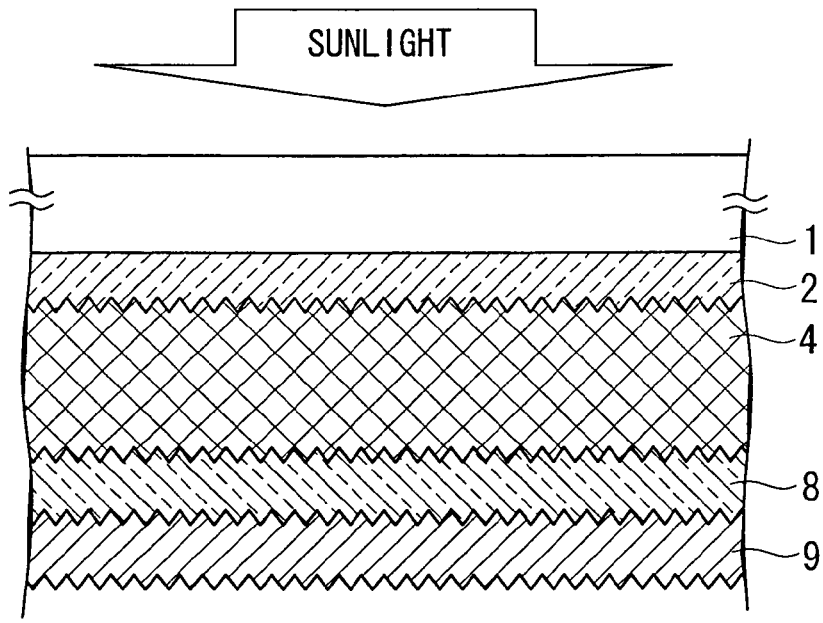
FIG. 1 A schematic partial cross-sectional view showing an example of a photovoltaic device having a single structure.

A method of setting the conditions for film deposition, a photovoltaic device and a production method and production apparatus therefore, and a test method according to the present invention can be applied to single structure photovoltaic devices or multi-junction photovoltaic devices. FIG. 1 is a schematic partial cross-sectional view showing an example of a single structure photovoltaic device, and FIG. 2 is a schematic partial cross-sectional view showing an example of a tandem structure photovoltaic device.

In the single photovoltaic device shown in FIG. 1, a first transparent conductive film 2 formed from $SnO_2$ or the like, a photovoltaic layer 4 containing mainly microcrystalline silicon, a second transparent conductive film 8 formed from $SnO_2$ or the like, and a back electrode 9 formed from a thin metal film of Ag or the like are deposited sequentially on top of a transparent electrically insulating substrate 1 such as a glass substrate.

Figure 2:
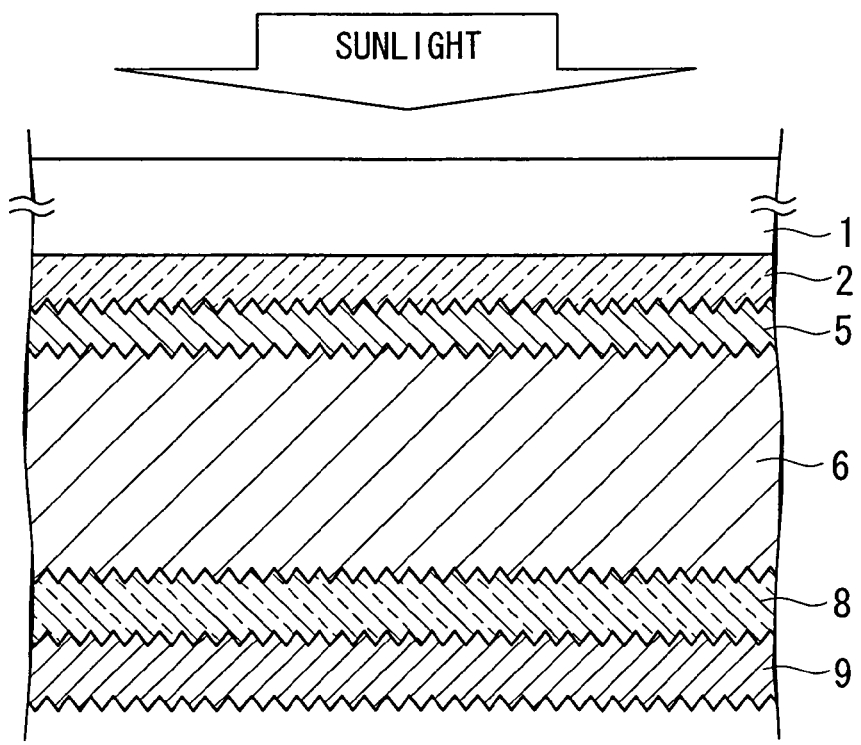
FIG. 2 A schematic partial cross-sectional view showing an example of a photovoltaic device having a tandem structure.

Furthermore, in the tandem photovoltaic device shown in FIG. 2, a first transparent conductive film 2 formed from $SnO_2$ or GZO or the like, a first photovoltaic layer (top cell) 5 containing mainly a semiconductor that absorbs light of short wavelength such as amorphous silicon, a second photovoltaic layer (bottom cell) 6 containing mainly microcrystalline silicon, a second transparent conductive film 8 formed from $SnO_2$, GZO or ITO or the like, and a back electrode 9 formed from Ag or the like are deposited sequentially on top of a transparent electrically insulating substrate 1 such as a glass substrate.

In the photovoltaic devices shown in FIG. 1 and FIG. 2, each of the photovoltaic layers has either a pin junction or a nip junction, and all of the photovoltaic layers are deposited using a plasma enhanced CVD method.

Figure 3:
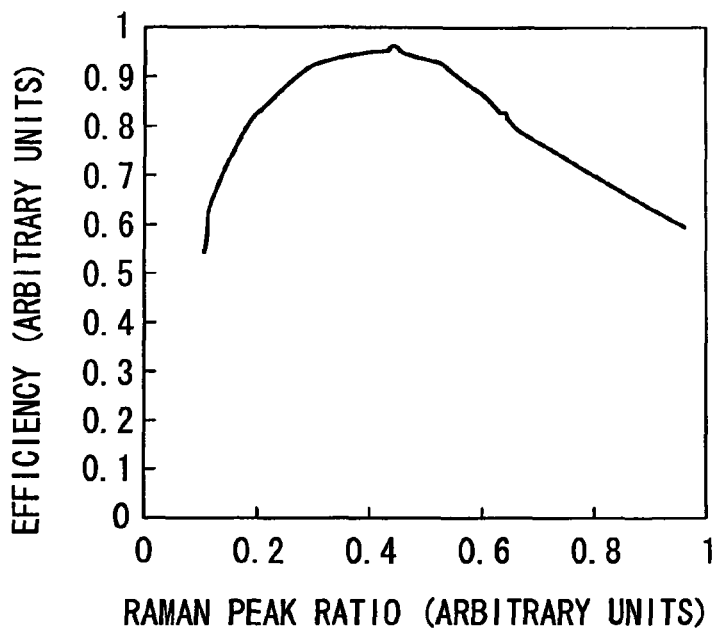
FIG. 3 A graph showing the relationship between the Raman peak ratio at the film surface side of a microcrystalline silicon photovoltaic layer, and the electric power generation efficiency.

In the present invention, a Raman spectroscopic method is used as an indicator for evaluating the film quality of photovoltaic layers containing mainly microcrystalline silicon. FIG. 3 is a graph showing the relationship, for a single photovoltaic device such as that shown in FIG. 1, between the ratio Ic/Ia (hereafter also referred to as the "Raman peak ratio") of the peak intensity Ic of the crystalline silicon phase relative to the peak intensity Ia of the amorphous silicon phase within the Raman spectrum obtained by irradiating a measuring light onto the photovoltaic layer 4 from the opposite side to the electrically insulating substrate 1 (the film surface side), and the electric power generation efficiency of the photovoltaic device.

The Raman peak ratio is an indicator of the crystallization ratio, and it is evident that at an ideal Raman peak ratio, the conversion efficiency of a photovoltaic device comprising the photovoltaic layer 4 containing microcrystalline silicon reaches a maximum, whereas if the Raman peak ratio is too high or too low, the conversion efficiency decreases. In other words, it is believed that the presence of an appropriate amorphous phase within the microcrystalline silicon is effective in electrically deactivating defects at the grain boundaries of the crystalline silicon phase.

Figure 4:
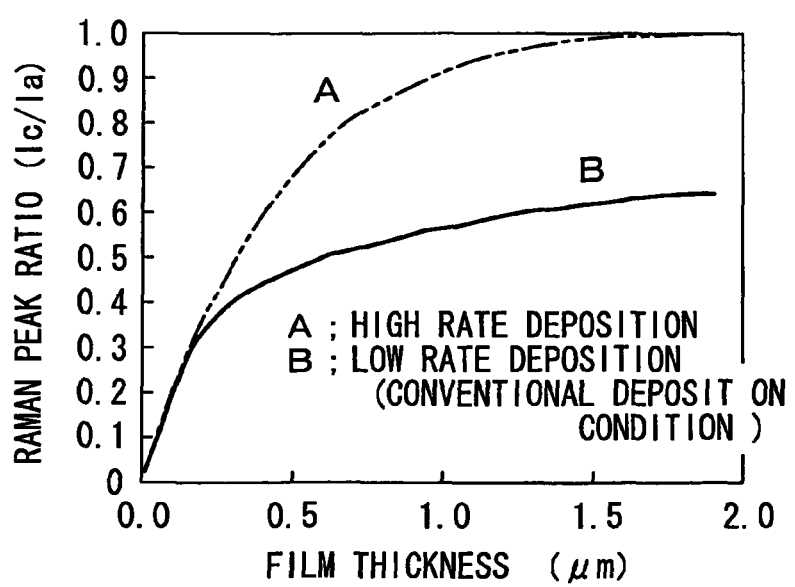
FIG. 4 A graph showing the relationship between the film thickness of a microcrystalline silicon photovoltaic layer, and the Raman peak ratio.

On the other hand, if the aforementioned Raman peak ratio is measured for photovoltaic layers 4 of differing film thicknesses containing microcrystalline silicon, then the relationship between the film thickness and the Raman peak ratio can be represented by the type of graph shown in FIG. 4. In FIG. 4, curve A represents an example of the Raman peak ratio when film deposition of the photovoltaic layer 4 is performed at a high film deposition rate of 1.5 nm/s or greater, whereas curve B represents an example of the Raman peak ratio when film deposition of the photovoltaic layer 4 is performed at a film deposition rate of not more than 1 nm/s.

From the graph of FIG. 4 it is evident that for the photovoltaic layer 4 containing microcrystalline silicon, the crystallization ratio and the Raman peak ratio both increase as the film growth progresses. In the case of high-rate film deposition, a dramatic change occurs in the crystallization ratio between the initial stages and the latter stages of film growth. In such a case, even if the crystallization ratio is suitable in the initial stages of film growth, it tends to be too high in the latter stages, whereas if the crystallization ratio is suitable in the latter stages, it tends to be too low in the initial stages. In other words, achieving a suitable crystallization ratio for the entire film is problematic. As a result, the process domain for depositing a microcrystalline silicon layer that functions as a photovoltaic layer 4 having a high conversion efficiency tends to be very narrow.

Accordingly, in the present invention, a measuring light is irradiated onto the microcrystalline silicon layer fabricated on the substrate, onto a portion of the layer on the side of the substrate, a first Raman peak ratio Ic(1)/Ia(1) that represents the ratio within the resulting Raman spectrum of the peak intensity Ic(1) of the crystalline silicon phase relative to the peak intensity Ia(1) of the amorphous silicon phase is determined, the measuring light is then irradiated onto a portion of the microcrystalline silicon layer on the opposite side to the substrate (the film surface side), a second Raman peak ratio Ic(2)/Ia(2) that represents the ratio within the resulting Raman spectrum of the peak intensity Ic(2) of the crystalline silicon phase relative to the peak intensity Ia(2) of the amorphous silicon phase is determined, and the film quality (the crystallization ratio) of the entire microcrystalline silicon layer is then evaluated based on the above first Raman peak ratio and second Raman peak ratio.

The method of setting conditions for film deposition according to the present invention is a method in which an already deposited microcrystalline silicon layer is evaluated using the method described above, and the conditions for film deposition of a microcrystalline silicon photovoltaic layer are then set on the basis of the results of the evaluation. The production process and production apparatus for a photovoltaic device according to the present invention are a method and apparatus for producing a photovoltaic device using film deposition conditions set via the above method of setting conditions for film deposition. The photovoltaic device of the present invention is a photovoltaic device in which the aforementioned first Raman peak ratio and second Raman peak ratio for the microcrystalline silicon photovoltaic layer both fall within specified ranges. Furthermore, the test method of the present invention is a method of testing a photovoltaic device by evaluating the microcrystalline silicon photovoltaic layer within the photovoltaic device using the method described above.

Figure 5:
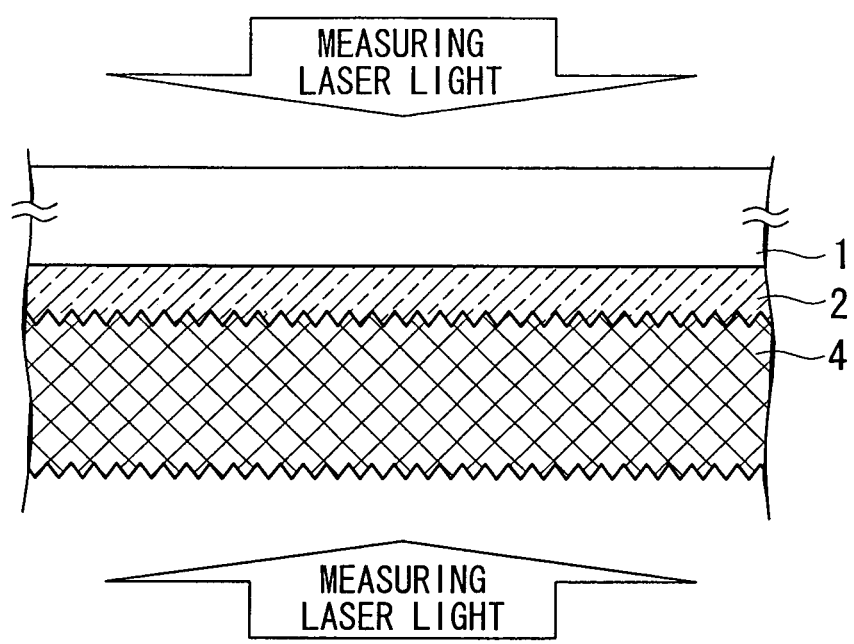
FIG. 5 A schematic partial cross-sectional view showing an example of a test piece used in a method of determining a first Raman peak ratio and a second Raman peak ratio.

Next is a description of an example of the method of determining the first Raman peak ratio and the second Raman peak ratio, based on FIG. 5. FIG. 5 is a schematic partial cross-sectional view showing an example of a test piece prepared by sequentially depositing a first transparent conductive film 2 and a photovoltaic layer 4 containing mainly microcrystalline silicon on top of a transparent electrically insulating substrate 1.

In the method of setting conditions for film deposition according to the present invention, the first Raman peak ratio and the second Raman peak ratio for the test piece can be measured following the completion of film deposition through to the photovoltaic layer 4 (the state shown in FIG. 5). On the other hand, in the method of testing a photovoltaic device according to the present invention, a test piece is prepared by solvent removal of the back electrode 9 of the photovoltaic device using a solvent such as a hydrogen peroxide solution. In this case, the Raman peak for the second transparent conductive film 8 can be subtracted as background, meaning the second transparent conductive film 8 need not necessarily be removed, although solvent removal using a solvent such as dilute hydrochloric acid may be performed if desired.

In order to measure the second Raman peak ratio, a measuring light is first irradiated onto the film surface side of the photovoltaic layer (the microcrystalline silicon layer) 4. Monochromatic laser light is used as the measuring light, and the use of frequency-doubled YAG laser light (wavelength: 532 nm) is ideal. When the measuring light is irradiated from the film surface side of the photovoltaic layer (the microcrystalline silicon layer) 4, Raman scattering is observed, and the measuring light and a portion of the scattered light are absorbed within the photovoltaic layer 4. For example, when frequency-doubled YAG laser light is used as the measuring light, information can be obtained from the incident surface down to a depth of approximately 100 nm.

In the Raman spectrum obtained by spectroscopic analysis of the emitted Raman scattered light, a first Raman peak ratio Ic(2)/Ia(2) that represents the ratio of the peak intensity Ic(2) of the crystalline silicon phase relative to the peak intensity Ia(2) of the amorphous silicon phase can be determined. Here, the "peak intensity of the amorphous silicon phase" typically refers to the peak intensity near a frequency of 480 $cm^{-1}$, whereas the "peak intensity of the crystalline silicon phase" typically refers to the peak intensity near a frequency of 520 $cm^{-1}$.

In order to measure the first Raman peak ratio, a measuring light irradiated from the side of the electrically insulating substrate 1 is first irradiated onto the insulating substrate side of the photovoltaic layer (the microcrystalline silicon layer) 4. Raman scattered light and light emitted from the electrically insulating substrate 1 and the first transparent conductive film 2 can be subtracted as background, meaning pretreatments for removing the effects of these components are unnecessary. Monochromatic laser light is used as the measuring light, and the use of frequency-doubled YAG laser light (wavelength: 532 nm) is ideal. In a similar manner to the measurement of the second Raman peak ratio, when frequency-doubled YAG laser light is used as the measuring light, information can be obtained from the incident surface down to a depth of approximately 100 nm.

In a similar manner to the measurement of the second Raman peak ratio, a first Raman peak ratio Ic(1)/Ia(1) that represents the ratio of the peak intensity Ic(1) of the crystalline silicon phase relative to the peak intensity Ia(1) of the amorphous silicon phase can be determined from the Raman spectrum obtained by spectroscopic analysis of the emitted Raman scattered light.

In the measurement of the first Raman peak ratio, in those cases where a structural element that blocks the measuring light exists between the site of irradiation of the measuring light and the photovoltaic layer (the microcrystalline silicon layer) 4, the second Raman peak ratio may be measured using a different method from that described above. Examples of such cases include, for example, the case where the photovoltaic device is a tandem structure that includes another photovoltaic layer such as an amorphous silicon layer or the like between the first transparent conductive film 2 and the photovoltaic layer (the microcrystalline silicon layer) 4, and the case where the photovoltaic device is a substrate-type photovoltaic device in which sunlight enters from the opposite side to the electrically insulating substrate 1, and a back electrode 9 formed from a thin metal film of Ag or the like is formed between the electrically insulating substrate 1 and the first transparent conductive film 2.

In cases such as those described above, the first Raman peak ratio may be measured by removing the film surface side of the photovoltaic layer (the microcrystalline silicon layer) 4 by dry etching or wet etching to leave not less than 100 nm and not more than 400 nm, and preferably not less than 200 nm and not more than 300 nm, of the insulating substrate side of the photovoltaic layer 4, subsequently irradiating the measuring light onto this residual microcrystalline silicon layer from the film surface side, and performing spectroscopic analysis of the Raman scattered light.

The microcrystalline silicon film can be etched by immersion within an etching liquid such as an aqueous solution of calcium hydroxide. However, with this type of wet etching, controlling the reaction rate and accurately detecting the end point are difficult, and consequently dry etching is preferred as the etching method for use in the present invention.

If a rare gas such as Ar is accelerated in an electric field and then fired perpendicularly onto the substrate, then sputtering occurs.

Down-flow chemical dry etching is a method in which etching is performed by channeling radicals generated by microwave discharge within a mixed gas of $CF_4$ and $O_2$ into an etching chamber. The etching rate is typically approximately 100 nm/minute. This method may be employed as the etching method used in the present invention.

By using a parallel plate electrode and positioning the substrate on the side of the earth electrode, chemical dry etching can be performed even at comparatively high gas pressures from 10 to 100 Pa. On the other hand, if the substrate is positioned on the side of the RF electrode, and the gas pressure is reduced to a value from 1 to several dozen Pa, then ions can be accelerated and irradiated perpendicularly onto the substrate. This method is called reactive ion etching, and is widely used in anisotropic etching. The etching used in the present invention does not particularly require anisotropy. Furthermore, minimizing the effect of ions is preferred, and consequently normal chemical dry etching is particularly advantageous.

Examples of the gas used for the etching include $CF_4$, $SF_6$, mixed gases of $CF_4$ and $H_2$, $CHF_3$, mixed gases of $CF_4$ and $O_2$, HBr, $Cl_2$, mixed gases of $Cl_2$, HBr and $O_2$, and mixed gases of HBr, $SF_6$ and $O_2$.

Alternatively, rather than removing the film surface side of the photovoltaic layer (the microcrystalline silicon layer) 4 in the manner described above, the second Raman peak ratio may be determined using the Raman spectrum obtained by irradiating the film surface side of the photovoltaic layer using either monochromatic laser light with a longer wavelength than a YAG laser that is capable of obtaining information down to a greater depth (for example, HeNe laser light (wavelength: 633 nm)) or a Ti:sapphire laser as the measuring light. In such cases, if HeNe laser light (wavelength: 633 nm) is used as the measuring light, then information can be obtained down to a depth of approximately 500 nm from the incident surface. Furthermore, if the 700 nm wavelength of a Ti:sapphire laser is selected, then information can be obtained down to a depth of approximately 1,400 nm. (Although the center oscillation wavelength of a Ti:sapphire laser is 800 nm, the wavelength can be altered from 690 to 1,000 nm, and consequently a 700 nm oscillation is possible. However the laser output is smaller than that at the center wavelength. Even when a YAG laser is used as the light source, if a parametric oscillation technique is employed using a nonlinear optical crystal such as barium β-borate, then laser oscillation of 700 nm is possible. Fixed wavelength lasers such as 785 nm semiconductor lasers are also useful.)

The photovoltaic device can be produced by setting the film deposition conditions for the microcrystalline silicon photovoltaic layer within the photovoltaic device based on the film deposition conditions when the first Raman peak ratio and second Raman peak ratio determined in the manner described above satisfy predetermined values.

Figure 6:
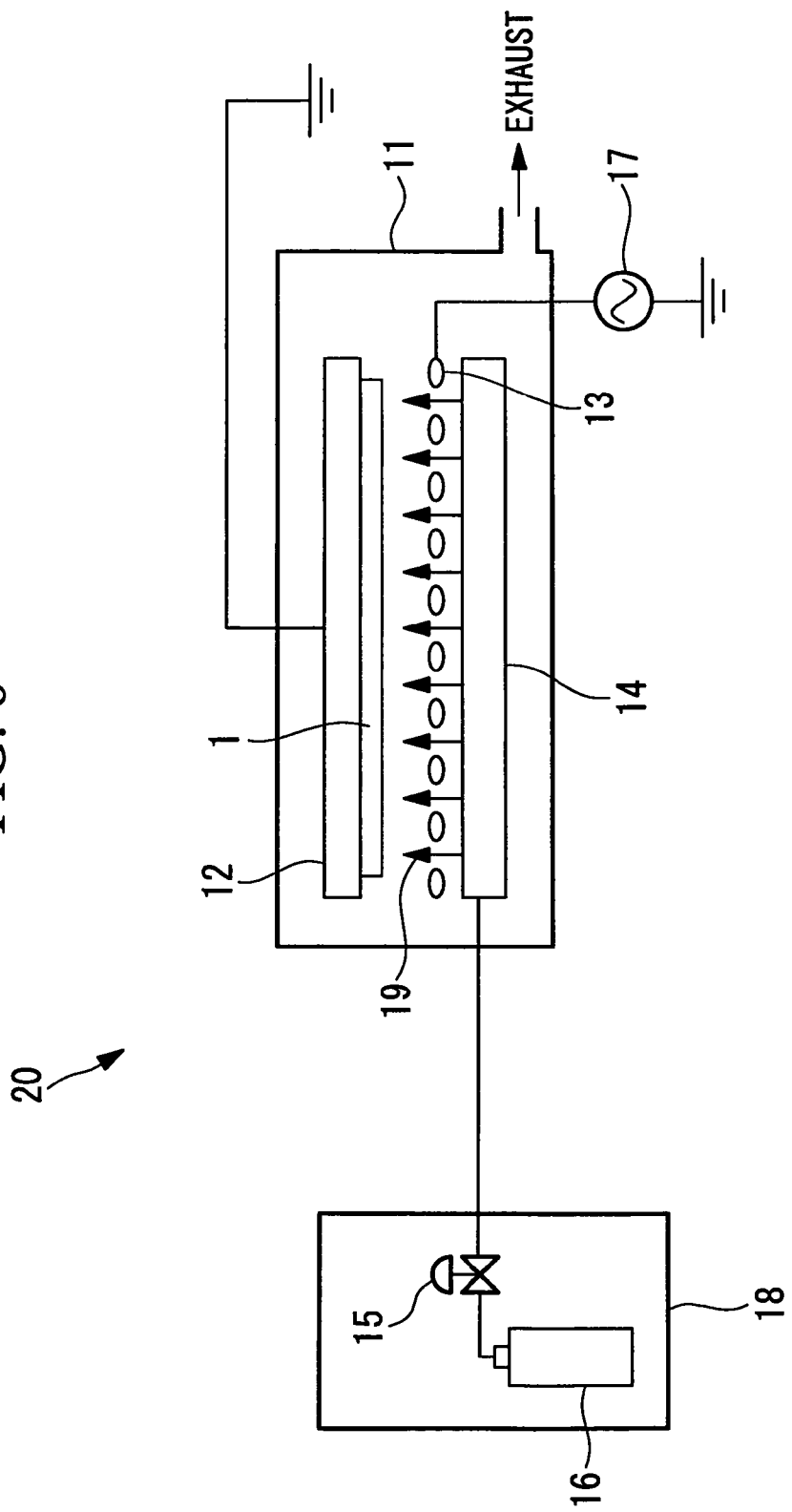
FIG. 6 A schematic view showing an example of a plasma enhanced CVD apparatus.

FIG. 6 is a schematic view showing an example of a plasma enhanced CVD apparatus used for producing the photovoltaic device in this embodiment. The plasma enhanced CVD apparatus 20 comprises a reaction chamber 11, an ultra high frequency power source 17, and a raw material gas supply unit 18. Furthermore, although not shown in the figure, the reaction chamber 11 is fitted with a turbomolecular pump or a rotary pump for vacuum evacuation of the reaction chamber 11, and a dry pump for exhausting the raw material gas. Moreover, although not shown in the figure, a separate plasma enhanced CVD apparatus 20 is provided for film deposition of each p-, i- and n-layer, and these plasma enhanced CVD apparatuses 20 are arranged so that the substrate can be transported under vacuum from one apparatus to the next via a transport chamber.

The ultra high frequency power source 17 supplies ultra high frequency electrical power with desired properties (for example, a plasma excitation frequency of 40 to 150 MHz) to the discharge electrode (described below) inside the reaction chamber 11.

The raw material gas supply unit 18 supplies a raw material gas 19 at a predetermined flow rate or flow rate ratio from a gas storage unit 16 to the reaction chamber 11 via a gas flow rate controller 15. The gas storage unit 16 is exemplified by a plurality of gas bottles containing different gases (such as $SiH_4$, $H_2$, $B_2H_6$ and $PH_3$). The gas flow rate controller 15 is exemplified by mass flow meters provided for each of the plurality of gas bottles.

In the reaction chamber 11, the supplied ultra high frequency electrical power and the supplied gas or plurality of gases enable films that form each of the layers of the photovoltaic device to be deposited on top of the substrate 1.

The reaction chamber 11 comprises an anode (support section) 12, a discharge electrode (cathode) 13, and a raw material gas inlet 14. The anode 12 incorporates a heater function for heating the substrate 1, and also supports and grounds the substrate 1. The discharge electrode 13 is supplied with the desired level of electrical power from the ultra high frequency power source 17, and generates a plasma of the supplied raw material gas 19 between the discharge electrode 13 and the anode 12. The discharge electrode 13 is separated from the substrate 1 by a predetermined gap, and opposes the anode 12 across the substrate 1. There are no particular restrictions on the shape of the discharge electrode 13, and a parallel plate electrode may be used. The raw material gas inlet 14 introduces the raw material gas 19 into the spaces within the discharge electrode 13 where the plasma is formed (the space between the anode 12 and the discharge electrode 13). The discharge electrode 13 and the raw material gas inlet 14 may be integrated, so that one of the components incorporates the function of the other.

The present invention is described in more detail below using reference examples.

REFERENCE EXAMPLE 1

Under the process conditions group A listed below, a plasma enhanced CVD method using a parallel plate electrode was used to deposit a photovoltaic layer 4 containing mainly microcrystalline silicon on top of a glass substrate (the electrically insulating substrate 1), thereby preparing a single structure photovoltaic device such as that shown in FIG. 1.

Process Conditions Group A

Figure 7:
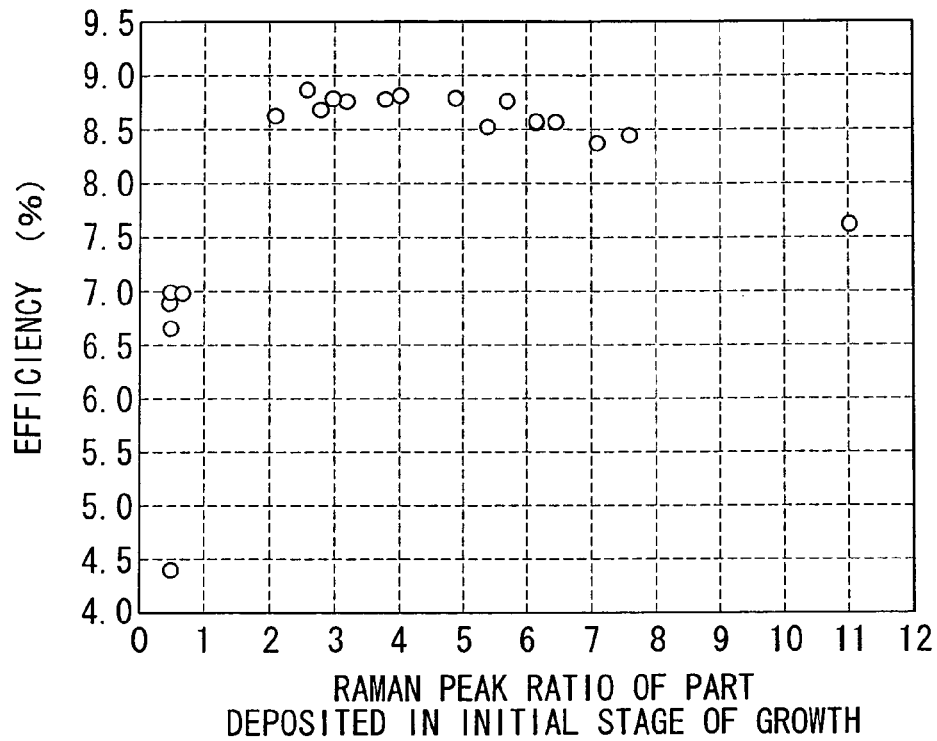
FIG. 7 A graph showing the relationship between the Raman peak ratio of the part deposited in the initial stages of film growth, and the electric power generation efficiency of the photovoltaic device, for the photovoltaic layer of a reference example 1.

Pressure: 2,130 Pa
Substrate temperature: 190° C.
Plasma frequency: 60 MHz
Plasma electrical power: 1.3 to 2.0 W/cm$^2$
Electrode-substrate separation: 3.5 to 7.5 mm FIG. 7 is a graph showing the relationship between the Raman peak ratio of the part deposited in the initial stages of film growth (the first Raman peak ratio Ic(1)/Ia(1)), and the electric power generation efficiency of the photovoltaic device containing the photovoltaic layer 4, for a photovoltaic layer 4 deposited under the above process conditions group A. Measurement of the Raman spectrum was performed by irradiating frequency-doubled YAG laser light (wavelength: 532 nm) from the side of the substrate surface.

The graph of FIG. 7 reveals that in the region in which a photovoltaic device electric power generation efficiency of 8.5% or greater was obtained, the Raman peak ratio of the part deposited in the initial stages of film growth was within a range from not less than 2 to not more than 6.5.

When the Raman spectrum is measured from the glass substrate surface, the spectrum may include a background. This background can be obtained by measuring only the glass, and is thought to represent light emission from the glass (Droz et al. Solar Energy Material & Solar Cells 81 (2004) 61 to 71). This background must be subtracted in order to determine the Raman peak ratio.

Figure 8:
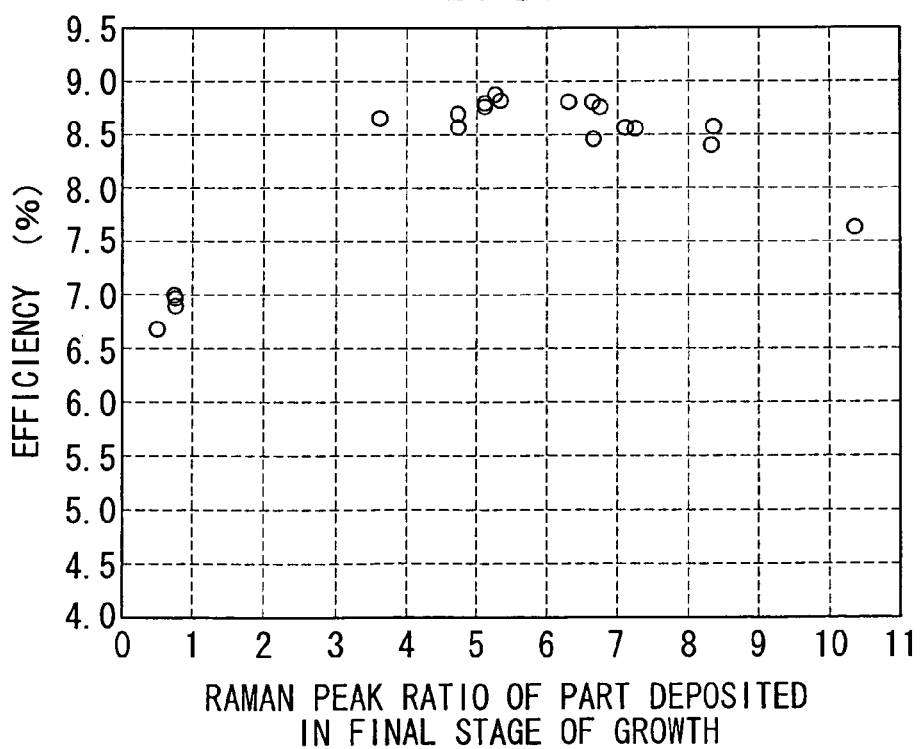
FIG. 8 A graph showing the relationship between the Raman peak ratio of the part deposited in the final stages of film growth, and the electric power generation efficiency of the photovoltaic device, for the photovoltaic layer of the reference example 1.

FIG. 8 is a graph showing the relationship between the Raman peak ratio of the part deposited in the final stages of film growth (the second Raman peak ratio Ic(2)/Ia(2)), and the electric power generation efficiency of the photovoltaic device containing the photovoltaic layer 4, for a photovoltaic layer deposited under the above process conditions group A. Measurement of the Raman spectrum was performed by irradiating frequency-doubled YAG laser light (wavelength: 532 nm) from the opposite side to the surface of the electrically insulating substrate 1 (namely, the film surface side).

The graph of FIG. 8 reveals that in the region in which a photovoltaic device electric power generation efficiency of 8.5% or greater was obtained, the Raman peak ratio of the part deposited in the final stages of film growth was within a range from not less than 3.5 to not more than 8.

Furthermore, based on the results obtained from the graphs of FIG. 7 and FIG. 8, it is evident that the Raman peak ratio from the initial stages of film growth through to the completion of film growth is preferably not less than 2 and not more than 8.

REFERENCE EXAMPLE 2

Under the process conditions group B listed below, a plasma enhanced CVD method using a parallel plate electrode was used to deposit a photovoltaic layer 4 containing mainly microcrystalline silicon on top of a glass substrate (the electrically insulating substrate 1), thereby preparing a single structure photovoltaic device such as that shown in FIG. 1.

Process Conditions Group B

Pressure: 2,133 Pa
Substrate temperature: 190° C.
Plasma frequency: 60 MHz
Plasma electrical power: 1.7 W/cm$^2$
Electrode-substrate separation: 5 mm The $SiH_4/H_2$ flow rate ratio was controlled so that the film surface side Raman peak ratio fell within a range from 5 to 6.

The photovoltaic layer 4 deposited under the process conditions group B listed above was evaluated in a similar manner to the reference example 1.

Figure 9:
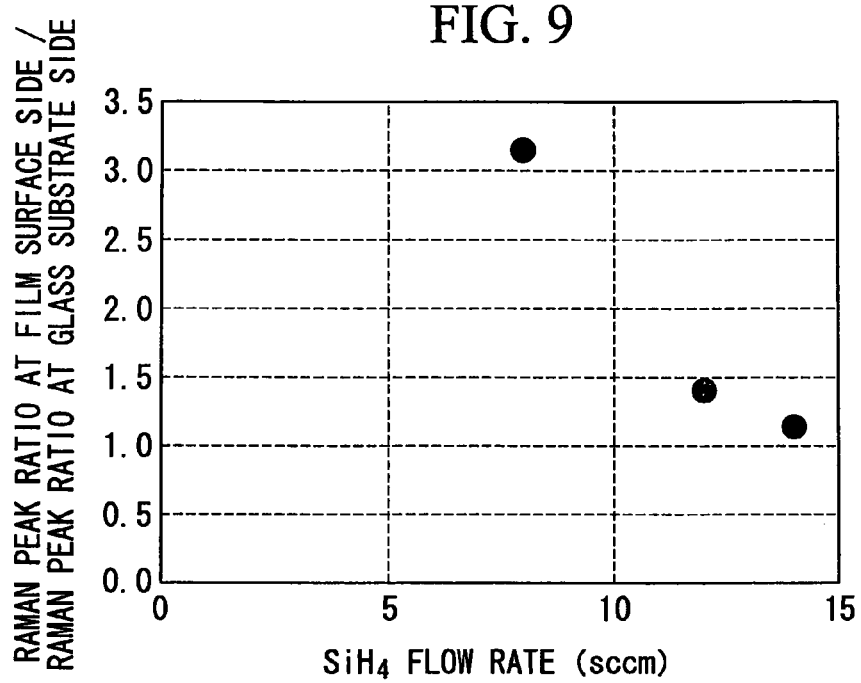
FIG. 9 A graph showing the relationship between the $SiH_4$ flow rate during film deposition of the photovoltaic layer of a reference example 2, and the value of [Raman peak ratio at film surface side/Raman peak ratio at substrate side] for the deposited photovoltaic layer.

FIG. 9 is a graph showing the relationship, for film deposition under the above process conditions group B, between the $SiH_4$ flow rate (the $SiH_4/H_2$ ratio is substantially equal), and the value of the ratio [Ic(2)/Ia(2)]/[Ic(1)/Ia(1)] of the Raman peak ratio of the part deposited in the final stages of film growth (the second Raman peak ratio Ic(2)/Ia(2); hereafter also referred to as the "Raman peak ratio at film surface side") relative to the Raman peak ratio of the part deposited in the initial stages of film growth (the first Raman peak ratio Ic(1)/Ia(1); hereafter also referred to as the "Raman peak ratio at substrate side") for the deposited photovoltaic layer 4.

In FIG. 9, the value of [Raman peak ratio at substrate side/Raman peak ratio at film surface side] decreases as the $SiH_4$ flow rate increases. In other words, the crystallinity in the direction of film growth is more uniform.

Because the $SiH_4$ and $H_2$ decompose within the film deposition chamber, the $SiH_4/H_2$ ratio within the supplied gas (the initial state) differs from the $SiH_4/H_2$ ratio within the normal state following plasma generation. When the flow rate of the supplied gas is low, the variation in the $SiH_4/H_2$ ratio between the initial state and the normal state is large, and it is known that this difference has an effect on changes in the crystallinity in the growth direction (Ichikawa, Sasaki, and Teii, "Purazuma Handotai Purosesu Kogaku (Plasma Process Technology for a Semiconductor)", Uchida Rokakuho Publishing, 2003, §4.1, page 103).

Generally, variation in the $SiH_4/H_2$ ratio over time is assumed to be severe not only in those cases when the flow rate is low, but also in cases where the plasma electrical power is large, and in cases where the decomposition of the gas is relatively severe. Accordingly, variation in the $SiH_4/H_2$ ratio over time is a phenomenon that is particularly problematic for high-rate film deposition.

Figure 10:
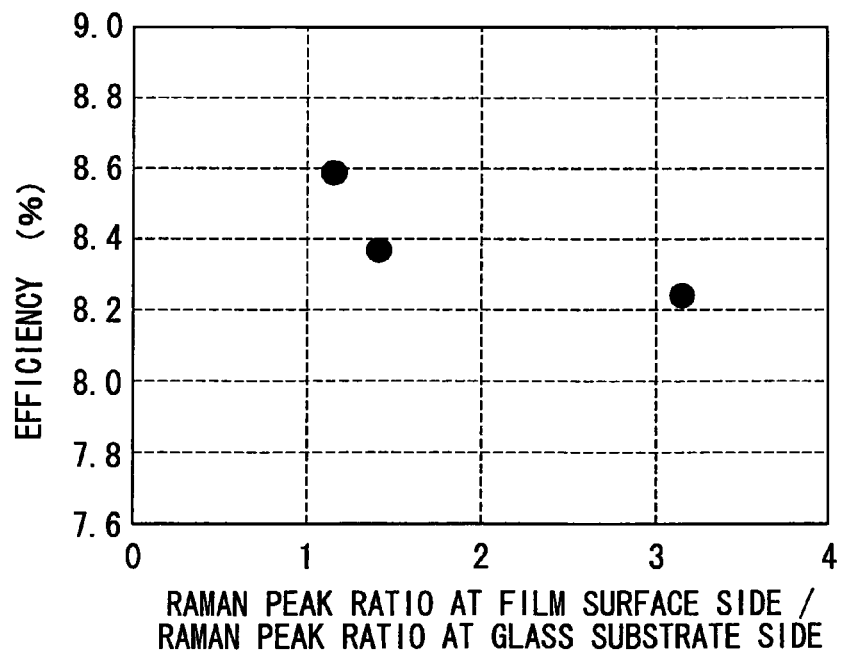
FIG. 10 A graph showing the relationship between the value of [Raman peak ratio at film surface side/Raman peak ratio at substrate side], and the electric power generation efficiency of the photovoltaic device, for the reference example 2.

FIG. 10 is a graph showing the relationship between the value of [Raman peak ratio at film surface side/Raman peak ratio at substrate side] and the electric power generation efficiency of the photovoltaic device for this reference example.

From FIG. 10 it is clear that the average electric power generation efficiency is higher for smaller values of [Raman peak ratio at film surface side/Raman peak ratio at substrate side], and the fluctuation in the electric power generation efficiency is small. From FIG. 10 it is evident that the value of [Raman peak ratio at film surface side/Raman peak ratio at substrate side] is preferably not more than 3, and is even more preferably 2 or less.

REFERENCE EXAMPLE 3

Photovoltaic devices prepared by setting the $SiH_4$ flow rate (total flow rate)/$H_2$ flow rate ratio to 14 sccm/2,000 sccm and 8 sccm/450 sccm during film deposition under the process conditions group B of the reference example 2 were used as samples.

The back electrode 9 and the transparent electrode film 8 (Ag/GZO) were removed from these samples by wet etching using hydrogen peroxide and hydrochloric acid. Subsequently, the photovoltaic layer 4 containing mainly microcrystalline silicon was subjected to chemical dry etching using $CF_4$ gas. Samples were removed from the chemical dry etching apparatus at the points where the film thickness was 100 nm, 500 nm, 1,000 nm, 1,500 nm and 2,000 nm respectively, each of these samples was irradiated with frequency-doubled YAG laser light (wavelength: 532 nm) from the film surface side of the sample, and the resulting Raman spectrum was measured. The Raman peak ratios at each of the film thickness values are shown in FIG. 11.

Figure 11:
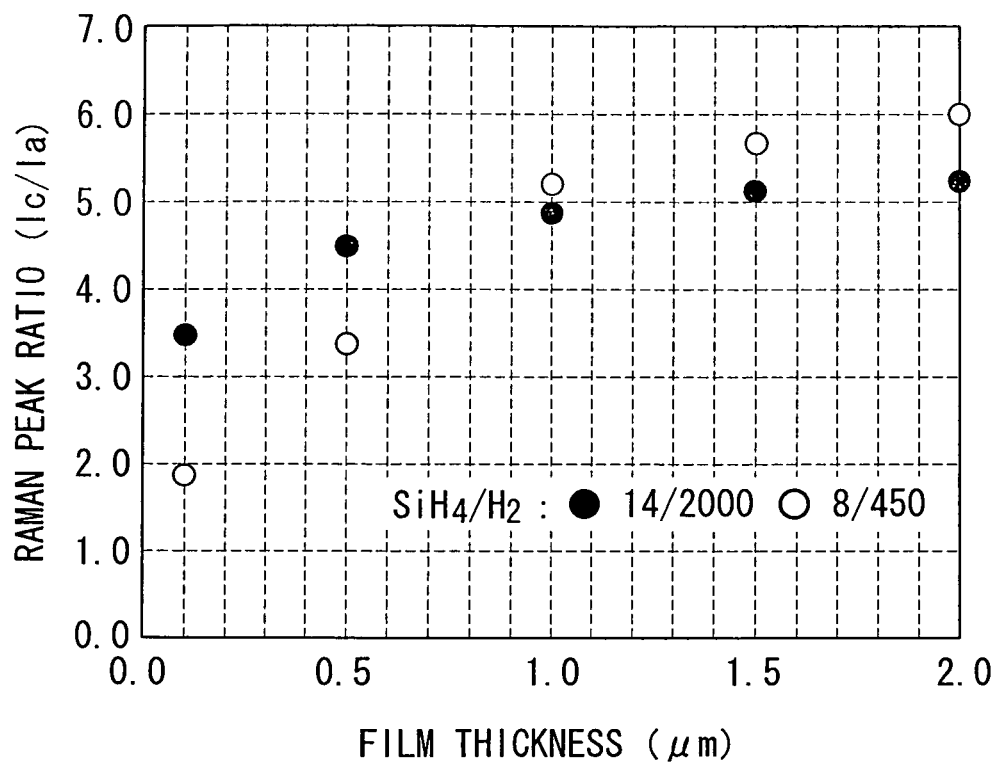
FIG. 11 A graph showing Raman peak ratios for various film thickness values for the photovoltaic layer of a reference example 3.

From FIG. 11 it is evident that the crystallinity in the direction of film growth is more uniform in the photovoltaic layer 4 prepared using $SiH_4/H_2$=14 sccm/2,000 sccm than in the photovoltaic layer 4 prepared using $SiH_4/H_2$=8 sccm/450 sccm. The electric power generation efficiency for the photovoltaic devices was 8.6±0.2% and 8.2±0.5% respectively. It is clear that photovoltaic devices for which the crystallinity in the direction of film growth is more uniform exhibit a higher average value and less fluctuation for the electric power generation efficiency.

In other words, film deposition using a supply gas flow rate ratio in which $SiH_4/H_2$=14 sccm/2,000 sccm is applicable to high-rate film deposition, and the present invention can be used particularly favorably in high-rate film deposition where the film deposition rate for the photovoltaic layer within a photovoltaic device is 2 nm/s or higher.

REFERENCE EXAMPLE 4

The data obtained by measurement of the Raman spectrum represents the data for the sample from the surface onto which the laser light is irradiated, down to a specific depth (the Raman collection depth).

In this reference example 4, similar photovoltaic devices to the reference example 3, prepared by setting the $SiH_4$ flow rate (total flow rate)/$H_2$ flow rate ratio to 14 sccm/2,000 sccm and 8 sccm/450 sccm during film deposition under the process conditions group B of the reference example 2, were used as samples.

In this reference example, the Raman spectrum was measured without etching the photovoltaic layer 4, by irradiating one of three different laser lights onto the film surface side of the sample. The Raman peak ratios obtained using each of the different laser lights are shown in Table 1.

TABLE 1

| | $SiH_4$/$H_2$ flow rate ratio (sccm/sccm) | |
| --- | --- | --- |
| Efficiency | 14/2000<br>8.6 ± 0.2% | 8/450<br>8.2 ± 0.5% |
| Frequency-doubled YAG laser (wavelength: 533 nm); Raman collection depth (microcrystalline Si): 100 nm | 5.2 | 6.0 |
| HeNe laser (excitation wavelength: 633 nm); Raman collection depth (microcrystalline Si): 500 nm | 5.1 | 5.7 |
| Ti: sapphire laser (excitation wavelength: 700 nm); Raman collection depth (microcrystalline Si): 1,400 nm | 4.5 | 3.4 |

The Raman collection depth for the HeNe laser was obtained by reference to the following publication. C. Droz et al. Solar Energy Material & Solar Cells 81 (2004) 61 to 71.

The photovoltaic layers 4 prepared using a $SiH_4$/$H_2$ flow rate ratio of 14/2,000 exhibited Raman peak ratios upon measurement with each of the lasers that were mutually more similar than the ratios obtained for the photovoltaic layers 4 in which the $SiH_4$/$H_2$ flow rate ratio was 8/450. It is thought that this observation is due to an increase in the crystallinity in the direction of film growth as the $SiH_4$ flow rate is increased. Furthermore, it is also clear that photovoltaic devices for which the crystallinity in the direction of film growth is more uniform exhibit a higher average value and less fluctuation for the electric power generation efficiency.

In other words, film deposition using a supply gas flow rate ratio in which $SiH_4$/$H_2$=14 sccm/2,000 sccm is applicable to high-rate film deposition, and the present invention can be used particularly favorably in high-rate film deposition where the film deposition rate for the photovoltaic layer within a photovoltaic device is 2 nm/s or higher.

The invention claimed is:

1. A method of setting conditions for film deposition of a microcrystalline silicon photovoltaic layer formed from a layer containing mainly microcrystalline silicon and provided within a photovoltaic device that comprises the microcrystalline silicon photovoltaic layer on top of a substrate, the method comprising the steps of:
depositing the microcrystalline silicon layer formed from a layer containing mainly microcrystalline silicon on top of a condition-setting substrate under a predetermined condition;
performing, at least once, a condition-setting step that comprises performing a first Raman spectroscopic measurement, by irradiating a measuring light onto a portion of the microcrystalline silicon layer on a side of the condition-setting substrate, and determining a first Raman peak ratio Ic(1)/Ia(1) that represents a ratio within a resulting Raman spectrum of a peak intensity Ic(1) of a crystalline silicon phase relative to a peak intensity Ia(1) of an amorphous silicon phase, and
performing a second Raman spectroscopic measurement, by irradiating the measuring light onto a portion of the microcrystalline silicon layer on an opposite side to the condition-setting substrate, and determining a second Raman peak ratio Ic(2)/Ia(2) that represents a ratio within a resulting Raman spectrum of a peak intensity Ic(2) of a crystalline silicon phase relative to a peak intensity Ia(2) of an amorphous silicon phase; and
setting conditions for film deposition of the microcrystalline silicon photovoltaic layer including pressure, substrate temperature, silane concentration within a reaction gas, plasma electrical power, plasma frequency, and electrode-substrate separation such that a ratio of the second Raman peak ratio relative to the first Raman peak ratio [Ic(2)/Ia(2)]/[Ic(1)/Ia(1)] is not more than 3, and both the first Raman peak ratio and the second Raman peak ratio are not less than 2 and not more than 8.

2. The method of setting conditions for film deposition according to claim 1, wherein the film deposition conditions are such that the first Raman peak ratio is not less than 2 and not more than 6.5, and the second Raman peak ratio is not less than 3.5 and not more than 8.

3. A process for producing a photovoltaic device comprising a microcrystalline silicon photovoltaic layer formed from a layer containing mainly microcrystalline silicon provided on top of a substrate, wherein
film deposition of the microcrystalline silicon photovoltaic layer on the substrate is performed under film deposition conditions set using the method of setting conditions for film deposition according to claim 1.

4. The process for producing a photovoltaic device according to claim 3, wherein a film deposition rate for the microcrystalline silicon photovoltaic layer is 1.5 nm/s or higher.

5. An apparatus for producing a photovoltaic device comprising a microcrystalline silicon photovoltaic layer formed from a layer containing mainly microcrystalline silicon provided on top of a substrate, wherein
film deposition of the microcrystalline silicon photovoltaic layer on the substrate is performed under film deposition conditions set using the method of setting conditions for film deposition according to claim 1.

6. The method of setting conditions for film deposition according to claim 1, wherein the conditions for film deposition of the microcrystalline silicon photovoltaic layer further includes $SiH_4$ flow rate/$H_2$ flow rate.

* * * * *